(12) United States Patent
Udo et al.

(10) Patent No.: US 6,812,725 B2
(45) Date of Patent: Nov. 2, 2004

(54) SEMICONDUCTOR PROCESSING APPARATUS AND WAFER SENSOR MODULE

(75) Inventors: Ryujiro Udo, Ushiku (JP); Masatsugu Arai, Chiyoda (JP); Manabu Edamura, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 123 days.

(21) Appl. No.: 10/083,255

(22) Filed: Feb. 27, 2002

(65) Prior Publication Data

US 2003/0160628 A1 Aug. 28, 2003

(51) Int. Cl.⁷ .............................................. G01R 31/00
(52) U.S. Cl. .................................... 324/765; 324/500
(58) Field of Search ............................. 438/14, 17, 18; 324/765, 537, 500, 158.1, 71.5, 230, 725, 755, 753, 224, 751, 750, 754; 257/48

(56) References Cited

U.S. PATENT DOCUMENTS 5,719,495 A * 2/1998 Moslehi .................... 324/158.1
6,124,725 A * 9/2000 Sato ............................ 324/765
2003/0226951 A1 * 12/2003 Ye et al. .................. 250/208.1

FOREIGN PATENT DOCUMENTS

JP          8-213374          8/1996

* cited by examiner

Primary Examiner—Kamand Cuneo
Assistant Examiner—Monica D. Harrison
(74) Attorney, Agent, or Firm—Antonelli, Terry, Stout & Kraus, LLP

(57) ABSTRACT

A semiconductor processing apparatus for processing a semiconductor in a processing chamber separated from the air wherein the processing chamber contains a wafer stage on which there is positioned a wafer sensor module equipped with sensor probes, each sensor probe capable of detecting at least one of electric current, voltage and temperature of an article to be processed and placed on the wafer sensor module, which is carried into the processing chamber by a transporting means for the article to be processed, and detected values by the sensor probes being converted to optical signals and led to outside of the processing chamber, can optimize conditions for processing the article easily and in a short time without lowering throughput.

18 Claims, 5 Drawing Sheets

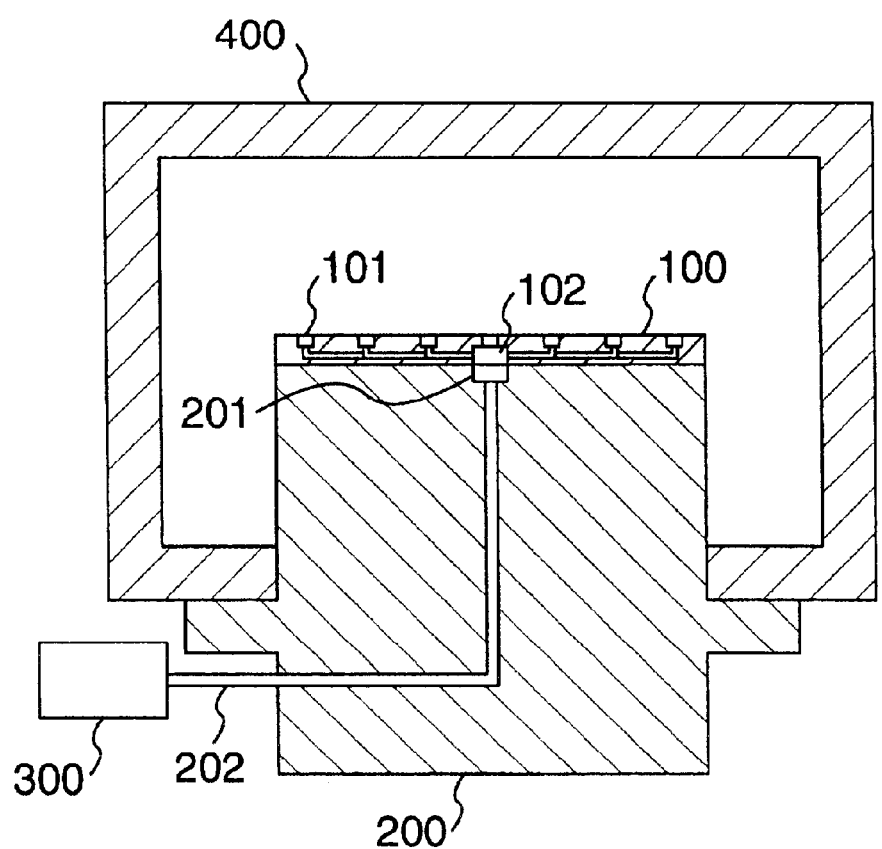

SEMICONDUCTOR PROCESSING APPARATUS AND WAFER SENSOR MODULE

BACKGROUND OF THE INVENTION

This invention relates to an apparatus for processing a semiconductor in an atmosphere separated from the air, and particularly to a semiconductor processing apparatus suitable for processing a semiconductor wafer by plasma processing.

In plasma processing semiconductor producing apparatuses such as a plasma etching apparatus, a plasma chemical vapor deposition apparatus, etc., electric current, voltage and temperature of wafer at plural points distributed on the surface of a wafer to be processed during semiconductor processing process and their distribution are remarkably important parameters in the semiconductor producing process. Therefore, in order to produce semiconductors in high precision, high efficiency and stably, to measure these values precisely before the processing becomes an important factor.

Heretofore, for such purposes, there have been proposed various sensor probes, some of which are practically used. Among them, there is a sensor module with a wafer shape equipped and used in a place where a wafer to be processed is positioned in a semiconductor processing apparatus. Such a sensor module is called in various ways, but in the present invention, it is named as "wafer sensor module".

One example of known wafer sensor modules is disclosed in JP-A-8-213374 as "diagnostic wafer", which is fundamentally formed by an aluminum circular plate subjected to anodic treatment, and comprises an ion current probe, a main portion of which is placed on a wafer, and an ion energy analyzer.

According to the above-mentioned prior art technology, since the equipment of the wafer sensor module in a semiconductor processing apparatus and removal of it therefrom were not considered, there was a problem of lowering in throughput caused by changes in processing contents and setting up in the semiconductor processing apparatus.

According to the known wafer sensor module such as the above-mentioned "diagnostic wafer", since it is electrically connected in the semiconductor producing apparatus and also connected to the outside, it is necessary to carry out connection working and dismantle working of electric wiring at the time of setting up and removal thereof.

Since the interior of the semiconductor producing apparatus is separated from the air, when the wafer sensor module is used, it is necessary to take out electric signals from the apparatus to the outside. According to the prior art technology, since electric wiring (a conducting wire) is used for transmission of electric signals, it is necessary to take out the wiring from the place separated from the air.

In order to take out the electric wiring from the place separated from the air, there have been used a method wherein a part called a current introducing terminal (or a penetrating terminal) is equipped in a through hole formed at a vacuum partition, and each electric wiring is connected to the current introducing terminal from the vacuum side and the air side, or a method wherein the periphery of electric wiring penetrating a through hole formed at a vacuum partition is sealed with an elastomer (e.g. a sealing material such as silicone rubber).

But, even if employing these methods, it is inevitable to conduct change of electric wiring and resealing treatment at the time of setting up and removal of the wafer sensor module. Thus, it is necessary to make the processing chamber open after stopping the semiconductor processing and producing apparatus temporarily, resulting in lowering the throughput.

Here, the measurement by means of the wafer sensor module is carried out before the beginning of the use of semiconductor producing apparatus, but if necessary, the measurement should be conducted with the predetermined frequency, for example, when the processing number of semiconductor wafers become a predetermined number. As a result, according to the prior art technology, the throughput is lowered as mentioned above.

BRIEF SUMMARY OF THE INVENTION

It is an object of the present invention to provide a semiconductor processing apparatus which can set up and remove a wafer sensor module without opening the processing chamber, and a wafer sensor module used in said apparatus.

Other objects, features and advantages of the invention will become apparent from the following description of the embodiments of the invention taken in conjunction with the accompanying drawings.

BRIEF DESCRIPTION OF THE DRAWINGS

FIG. 9 is a diagrammatic view for explaining further embodiment of the semiconductor wafer processing apparatus of the present invention.

DETAILED DESCRIPTION OF THE INVENTION

The above-mentioned object of the present invention can be attained by an apparatus for processing a semiconductor, which comprises an airtight processing chamber separated from the air, a stage installed in the chamber, and a wafer sensor module equipped with sensor probes, each sensor probe capable of detecting at least one of electric current passing through an article to be processed, voltage and temperature, said wafer sensor module positioned on the stage after carried in the processing chamber by a transporting means for the article (semiconductor wafer) to be treated.

At this time, the above-mentioned object can also be attained by the apparatus wherein measured values detected by the sensor probes are converted to optical signals, which are lead out from the wafer sensor module to the outside of the processing chamber.

The above-mentioned object can further be attained by the apparatus wherein the optical signals are received by a means for receiving optical signals equipped on the stage.

In addition, the above-mentioned object can be attained by the apparatus wherein the stage has a means for applying an optional voltage to at least one point of the wafer sensor module.

Further, the above-mentioned object can be attained by the apparatus wherein the means for receiving optical signals processes at least two optical signals caused by measured values in common and leads to outside of the semiconductor processing apparatus.

The present invention also provides a wafer sensor module comprising a silicon substrate as a main body, and at least one sensor probe and a luminescent device formed thereon.

In the above-mentioned wafer sensor module, the silicon substrate as a main body has almost the same shape as a semiconductor wafer to be processed.

The semiconductor processing apparatus of the present invention is explained in detail referring to embodiments of the drawings.

Figure 1:
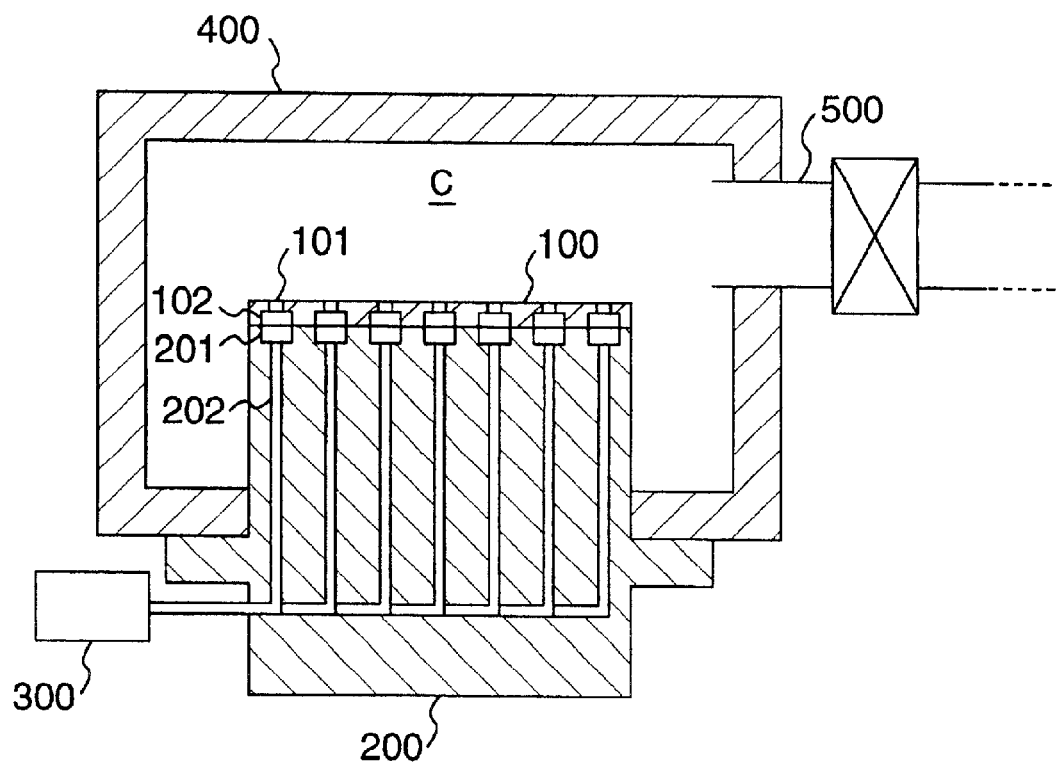
FIG. 1 is a diagrammatic view for explaining one embodiment of the semiconductor wafer processing apparatus of the present invention.

FIG. 1 is a diagrammatic view for explaining one embodiment of the semiconductor wafer processing apparatus of the present invention, wherein a vacuum container 400 forms a processing chamber C separated from the air and necessary, for example, for plasma processing. In the vacuum container, the air is exhausted to obtain vacuum, then a suitable processing gas is introduced thereinto to generate plasma (not shown in the drawing) in the processing chamber C using a plasma generating device (not shown in the drawing).

In the vacuum container 400, a wafer stage 200 is equipped and a transporting system 500 is equipped at the side of the vacuum container.

Bias voltage is applied from a bias power source (not shown in the drawing) to the wafer stage 200, and by this the plasma generated in the processing chamber C is drawn in the direction of the wafer stage 200.

The transporting system 500 is equipped with a transporting mechanism not shown in the drawing, and carries a semiconductor wafer to be processed into the processing chamber C, while maintaining the state almost separated from the outside to position the semiconductor wafer on the wafer stage 200. The semiconductor wafer positioned on the wafer stage 200 after processing is carried out of the processing chamber C by the transporting system while maintaining the state almost separated from the outside.

In the embodiment of FIG. 1, numeral 100 denotes a wafer sensor module which has almost the same size as the semiconductor wafer to be processed and positioned on the wafer stage 200. The semiconductor wafer to be processed (not shown in the drawing) is to be positioned in exchange of the wafer sensor module 100.

In FIG. 1, numeral 101 denotes a sensor probe, numeral 102 denotes a luminescent device, and numeral 201 denotes a receiving optics.

Figure 2:
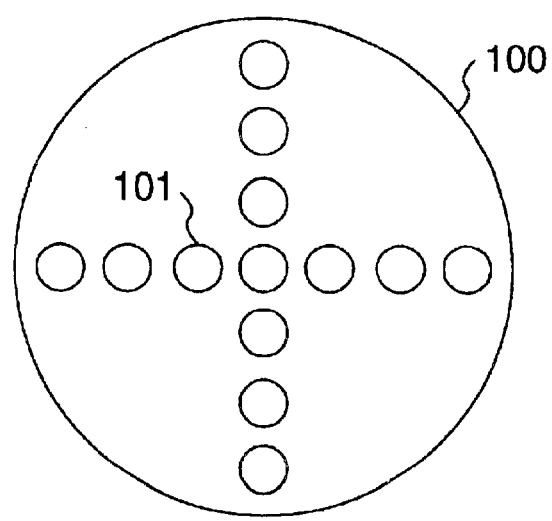
FIG. 2 is a plan view of one embodiment of wafer sensor module of the present invention.

The sensor probes 101 are positioned on the surface of the wafer sensor module 100 in a plural number with a predetermined pattern as shown in FIG. 2. Each sensor probe can measure at least one of ion current, voltage distribution and temperature as an object to be measured.

Individual luminescent devices 102 are positioned on a rear side of the wafer sensor module 100 so as to be combined with individual sensor probes 101 and placed in the same positions as the sensor probes 101, respectively, when viewed from above the drawing. Each luminescent device 102 is connected to corresponding sensor probe 101, and emits light of which wavelength is depending on measured values of current, voltage distribution, temperature, etc. detected by or with the each sensor probe 101.

Thus, the wafer sensor module 100 has a shape of circular plate as a main body on one side of which is buried each sensor probe 101 and on another side of which is buried each luminescent device 102, respectively. As the main body, there can be used, for example, a silicon plate.

On the other hand, in FIG. 1, numeral 201 denotes a light receiving portion, which is positioned opposite to each luminescent device 102 when the wafer sensor module 100 is positioned on the upper side of the wafer stage 200, and functions so as to collect and take in the light generated by each luminescent device 102 effectively. Thus, the light receiving portion is constructed by a lens having a predetermined size.

Numeral 202 denotes a light guide, which functions to lead out the light taken in each light receiving portion 201 to the outside independently. Thus, each upper end of vertical portion of the light guide in the wafer stage 200 is connected to respective light receiving portion 201. The light guide is made of, for example, an optical fiber having a predetermined diameter and positioned in the wafer stage 200 so as to lead out the light independently outside of the vacuum container 400.

In FIG. 1, numeral 300 denotes a conversion device which is equipped with a light receiving portion connected to light lead-out end of respective light guide 202 and functions to convert the light led out from each light guide 202 to a predetermined voltage depending on the wavelength of light.

Next, operation of the semiconductor processing apparatus of the present invention is explained referring to one embodiment of FIG. 1.

In this semiconductor processing apparatus, first, a wafer sensor module 100 is previously prepared depending on the kind of semiconductor wafer to be processed and the kind of processing to be conducted. The wafer sensor module 100 to be prepared is one having sensor probes 101 with a predetermined number and a predetermined pattern depending on for detecting current, detecting voltage, detecting temperature, etc. necessary for the semiconductor wafer.

Before starting the processing of semiconductor wafer, the wafer sensor module 100 is first carried in the processing chamber C by the wafer transporting system 500 and positioned on the wafer stage 200. At this time, each luminescent device 102 on the under side of wafer sensor module 100 is placed so as to be opposite to each light receiving portion 201 on the upper side of the wafer stage 200.

As explained above, the wafer sensor module 100 has almost the same size as the semiconductor wafer, which is carried by the wafer transporting system 500. Thus, the transportation of the wafer sensor module 100 by the wafer transporting system 500 can be carried out in the same manner as the semiconductor wafer with precisely and easily.

As a result, it is not necessary to conduct working of connection of wires to sensors, etc. and preparation of measurements necessary for processing the semiconductor wafer is finished only by this. Thus, processing for the semiconductor wafer such as plasma processing is started.

As a result, ion current passes through the wafer sensor module 100, voltage generates on the wafer sensor and temperature of the wafer sensor changes, and these are detected by sensor probes 101, respectively, to make each luminescent device 102 emit light.

The optical signals generated by each luminescent device 102 and incident upon each opposite light receiving portion 201 are transferred to the wafer stage 200 side. The signals by light introduced from each light receiving portion 201 pass through each light guide 202 in the wafer stage 200 and taken out to the outside of the vacuum container 400, and led to light receiving portion equipped depending on kinds of measurements in the conversion device 300.

By measuring the voltage output from the conversion device 300, the ion current, voltage distribution and temperature can be recognized to obtain necessary data for setting necessary processing conditions. As a result, it is possible to contribute for carrying out suitable processing of the semiconductor wafer hereinafter. Therefore, according to this embodiment, very high throughput in the processing of semiconductor wafers can always be maintained without fail.

Then, details of the wafer sensor module 100 are explained below.

Positions of each sensor probe 101 are crosswise in FIG. 2, but not limited thereto. In the case of FIG. 2, ion current, voltage distribution and temperature at the position of each sensor probe 101 can be measured.

The positions, numbers and positional pattern of individual sensor probes 101 can be set optionally and can be changed depending on necessity. For example, it is possible to take a lattice-like pattern, a concentric circle pattern, or the like. As to the plasma processing, when the plasma distribution is regarded as symmetrical as to the center axis, it is sufficient to position only on a radius.

Next, details of the sensor probes 101 are explained below. The sensor probes including the main body of the wafer sensor module 100 can be made of single crystal silicon wafer as a raw material.

Reasons for employing the single crystal silicon wafer as the raw material are as follows.

The single crystal silicon wafer is supplied for producing semiconductors with relatively cheap and in a large amount. Further, since it is the same as the material worked practically in the semiconductor producing process, special attention for handling, and the like is not necessary, and various devices can easily be formed by similar process for producing semiconductors and already established dry and wet etching steps and film forming steps, so that facilities are very high.

Figure 3:
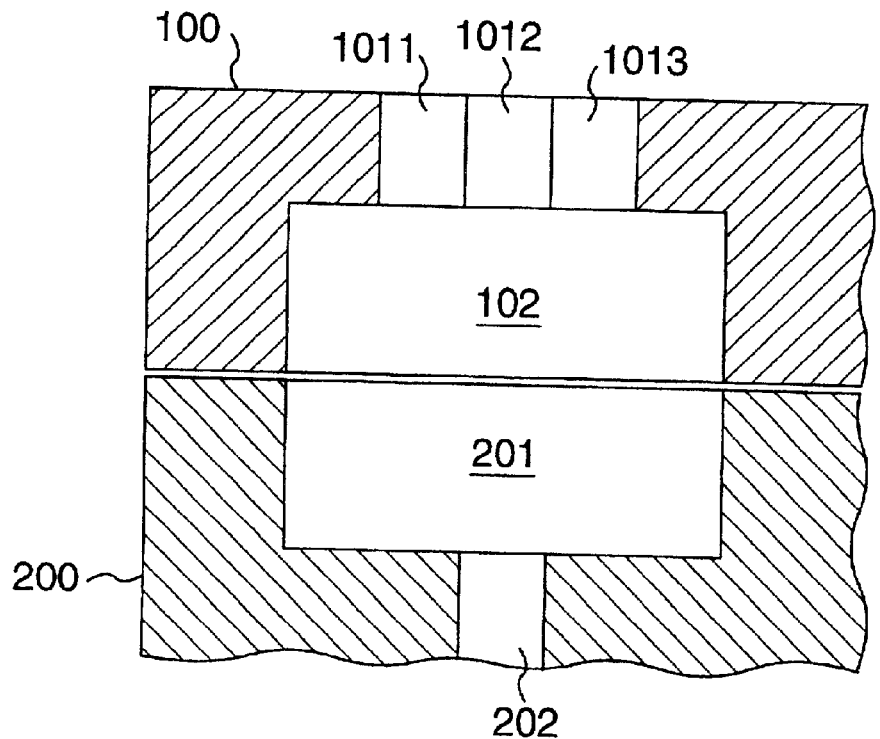
FIG. 3 is an enlarged cross-sectional view of a sensor probe portion of one embodiment of wafer sensor module of the present invention.

FIG. 3 shows another embodiment of the wafer sensor module 100, wherein as each sensor probe 101, 3 kinds of current sensor probe 1011, voltage sensor probe 1012 and temperature sensor probe 1013 are formed on upper side of the wafer sensor module 100.

Figure 4:
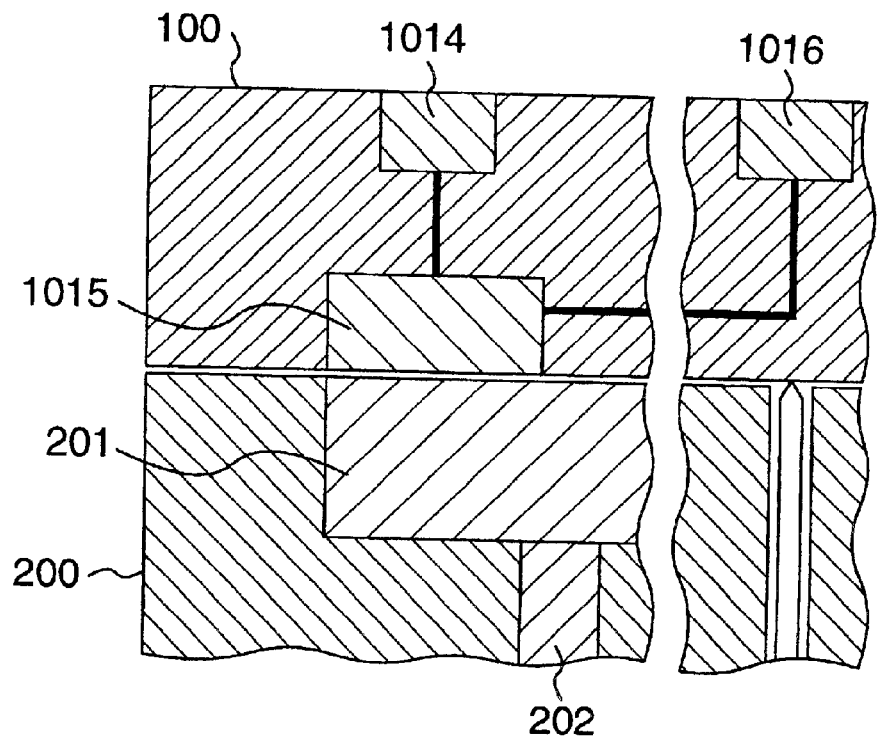
FIG. 4 is an enlarged cross-sectional view of voltage sensor probe in one embodiment of the present invention.

The voltage sensor probe 1012 are formed of electrode 1014, light emitting diode (LED) 1015 connected to one terminal of the electrode 1014, and reference electrode 1016 connected to another terminal of the LED 1015 as shown in FIG. 4. In this case, the reference electrode 1016 is formed with a predetermined distance from the electrode 1014.

The LED 1015 is made of an assembly of plural different LED having known threshold voltage, so that color properties obtained by light emission are different each other. Thus, by this, lights with different colors are emitted depending on voltage difference between the electrode 1014 and reference electrode 1016.

The light emitted from the LED 1015 is received by the opposite light receiving portion 201 on the wafer stage 200 side, followed by passing through the light guide 202 to the outside of the semiconductor producing apparatus and input to the conversion device 300.

The conversion device 300 is a device for converting optical signals to electric signals, and outputs predetermined voltage signals depending on the color of light input. From the correspondence of voltage of this signal to the known threshold voltage of LED, the conversion device can display a voltage difference between the electrode 1014 and the reference electrode 1016 in an indicator (not shown in the drawing).

Figure 5:
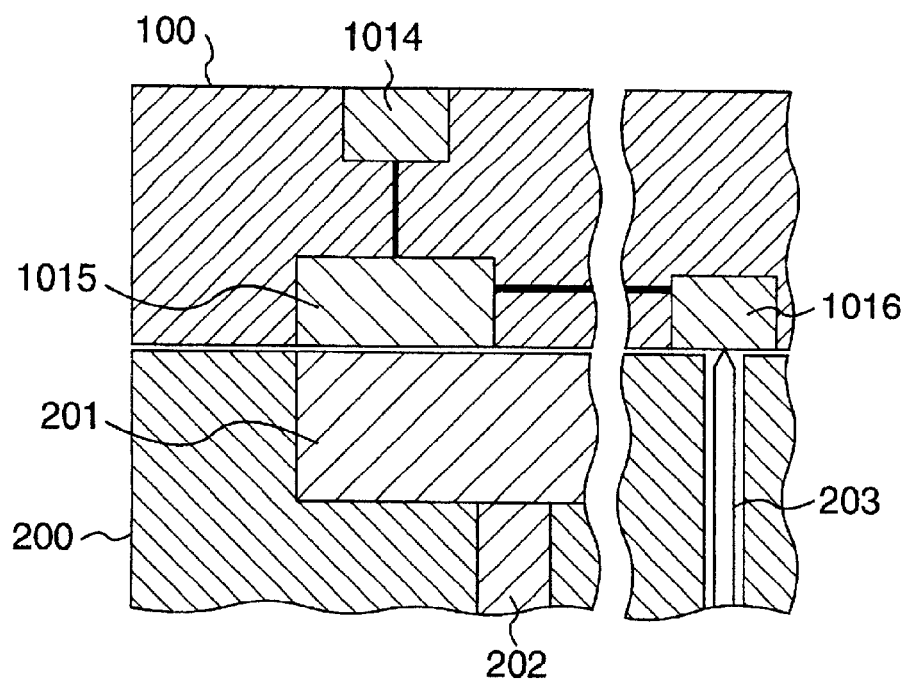
FIG. 5 is an enlarged cross-sectional view of voltage sensor probe in another embodiment of the present invention.

FIG. 5 shows another embodiment of the voltage sensor probe 1012. As shown in FIG. 5, a contact pin 203 which penetrates the wafer stage 200 to contact with the reference electrode 1016, can give optional known voltage to the reference electrode 1016 from the outside. According to this embodiment, it is possible to measure an absolute voltage of the electrode 1014.

Figure 6:
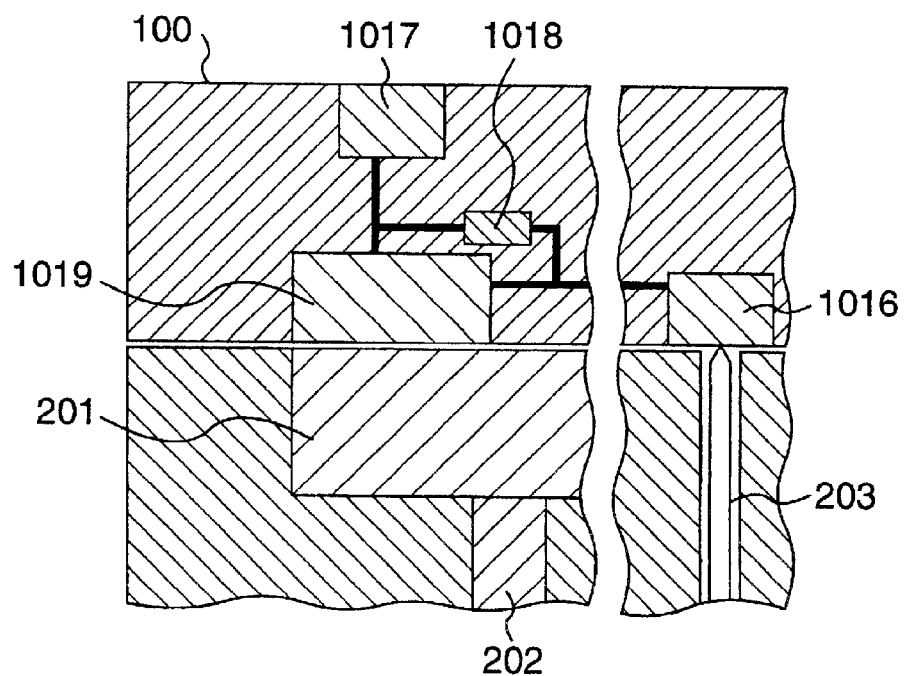
FIG. 6 is an enlarged cross-sectional view of current sensor probe in one embodiment of the present invention.
Figure 7:
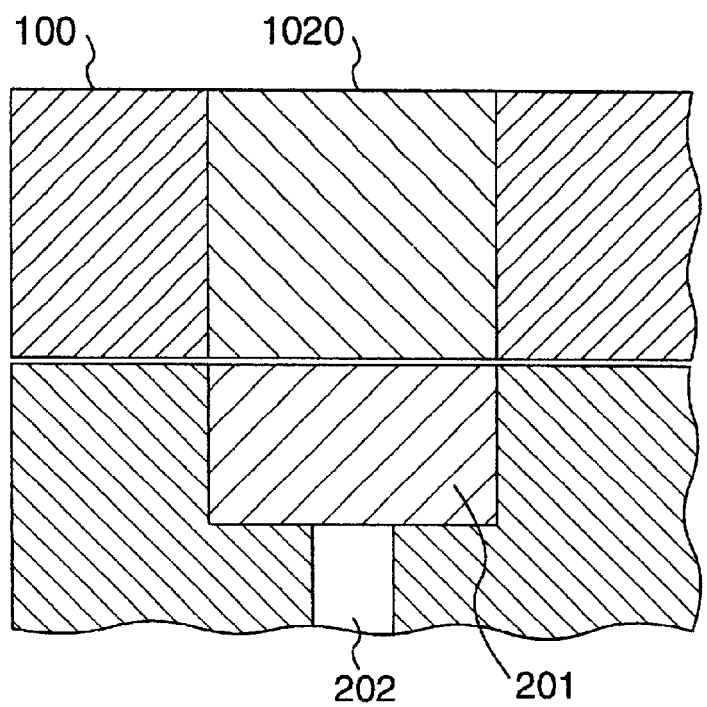
FIG. 7 is an enlarged cross-sectional view of temperature sensor probe in one embodiment of the present invention.

Next, the current sensor probe 1011 shown in FIG. 3 is explained below, although not in order. The current sensor probe 1011 is formed of the reference electrode 1016, electrode 1017, resistor 1018 and LED 1019 as shown in FIG. 6. The reference electrode 1016 is contacted with the contact pin 203 in the wafer stage 200 side like the case of the voltage sensor probe shown in FIG. 5.

The resistor 1018 has a known resistance value and connected to the LED 1019 in parallel between the electrode 1017 and the reference electrode 1016. Further, the reference electrode 1016 contacts with the contact pin 203 positioned by penetrating the wafer stage 200 and is given by optional voltage.

The current flowing into the electrode 1017 passes through the reference electrode 1016 via the resistor 1018. At this time, among terminals of resistor 1018, there is generated a voltage difference, which is determined by the current value and the resistance value of the resistor 1018 and is applied to the LED 1019.

The LED 1019 is constructed by an assembly of a plurality of different LED having a known threshold voltage and having different color properties obtained by light emission. By this, different colors of lights are generated dependent on the voltage difference between the electrode 1014 and the reference electrode 1016, that is, the voltage corresponding to the current value flowed into the electrode 1017.

The light emitted from the LED 1019 is received by the opposite light receiving portion 201 on the side of the wafer stage 200, and led to the outside of the semiconductor producing apparatus via the light guide 202 to input into the conversion device 300. As a result, in the same manner as described in the voltage sensor probe mentioned above, it is possible to display the current value flowed into the electrode 1017 in the indicator not shown in the drawing.

Next, the temperature sensor 1013 shown in FIG. 3 is explained. This is obtained by only burying a phosphor 1020 in a predetermined place of the wafer sensor module 100. The phosphor 1020 is a fluorescent substance which emits specific fluorescence at a specific temperature.

Therefore, by inputting the fluorescence emitted from the phosphor 1020 to the conversion device 300 via the light receiving portion 201 and the light guide 2002, it is possible to display the temperature of the position wherein the phosphor 1020 is set in the indicator not shown in the drawing.

As mentioned above, by any of the wafer sensor module 100 explained in FIGS. 3 to 7, it is possible to measure the current, voltage and temperature of the semiconductor wafer easily by only positioning the wafer sensor module on the wafer stage 200 without operation of changing connection of wires.

Figure 8:
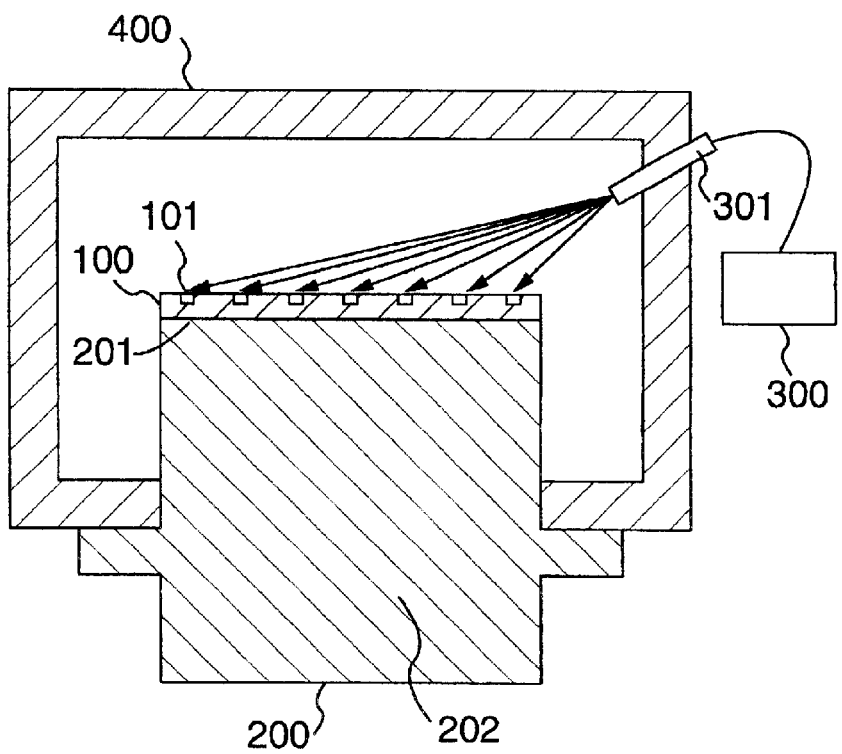
FIG. 8 is a diagrammatic view for explaining another embodiment of the semiconductor wafer processing apparatus of the present invention.

Next, another embodiment of the present invention is explained below. FIG. 8 shows a second embodiment of the present invention, wherein the light receiving device 301 is provided on a side wall of the vacuum container 400 and can detect lights emitted from respective sensor probes 101 of the wafer sensor module 100. Other constitution including the vacuum container 400 is the same as that of FIG. 1, but the wafer transporting system 500 is omitted for simplification.

In this embodiment, the fundamental constitution of the wafer sensor module 100 per se is the same as the wafer sensor module 100 explained in FIGS. 1 to 7. In the embodiment of FIG. 8, one different point is that each luminescent device of sensor probe 101 is positioned on the upper side of the wafer sensor module. In this case, each LED and phosphor constituting each luminescent device is designed to emit different color of light.

More concretely, in the case of current sensor probe, it is designed to emit individually in the red region in the visible light range, in the case of voltage sensor probe, it is designed to emit individually in the green region, and in the case of temperature sensor probe, it is designed to emit individually in the blue region.

In compliance with this, the light receiving device is designed to detect light intensity individually in each color region in the visible light range. In this case, it is also designed to select individually sensor probes 101 and to take in the light therefrom preponderantly from whole the surface of the wafer sensor module 100 as shown in FIG. 8. For such a purpose, it is possible to use a television camera, or to use a light receiving device limited in the field of vision to the size of individual sensor probe 101 and scanning whole surface of the wafer sensor probe 100 as to the light receiving axis.

Each light emitted from each sensor probe 101 is received by the light receiving device 301 and input to the conversion device 300. As a result, it is possible in this embodiment to recognize the current, voltage and temperature detected by each sensor probe 101 at the outside. Thus, according to this embodiment, it is also clear that only by positioning the wafer sensor module 100 on the wafer stage 200 by the wafer transporting system 500, the measurement of current, voltage and temperature of the semiconductor wafer becomes possible easily without operation of changing wires for connection, and the like.

In the embodiment of FIG. 8, since the plasma is directly irradiated on the wafer sensor module 100 positioning the sensor probes 101, the light from the plasma is also received by the light receiving device 301. In order to remove influence of the light of plasma, it is necessary to intercept the plasma light by using, for example, a band-pass filter, etc. not shown in the drawing. Further, in order to minimize damages of the sensor probes 101 caused by the plasma, it is desirable to provide a protective means for the sensor probes 101 of the wafer sensor module 100.

Further, in the case of the embodiment of FIG. 8, since it is not necessary to provide a light receiving portion and a light guide such as optical cable, etc., there is no fear of making the constitution of wafer stage complicated, resulting in providing advantages such as degree of freedom of design being heightened, application to conventional apparatuses becoming easy and the like.

FIG. 9 shows a third embodiment of the present invention. In this embodiment, individual luminescent devices 102 in the embodiment of FIG. 1 are collected to one place in a sheet of wafer sensor module 100. In compliance with this, the light receiving portion 201 is collected to one place on the wafer stage 200 side. The received light is led to the conversion device 300 via one light guide 202.

At least one detected value selected from current, voltage and temperature detected by each sensor probe 101 is converted to light signals having different colors, so that even if the light signals were collected by the light receiving portion 201 and input to the conversion device 300 via one light guide 202 in common, it is possible to separate the light signals to those from individual sensor probes 101 by using a filter.

Thus, according to this embodiment, it is also possible only by positioning the wafer sensor module 100 on the wafer stage 200 by the wafer transporting system 500, the measurement of current, voltage and temperature of the semiconductor wafer becomes possible easily without operation of changing wires for connection, and the like.

Further, in the case of using the wafer sensor module 100 of FIG. 9, since the number of light receiving portion and the number of light guide positioned in the wafer stage 200 can be minimized, there can be obtained advantages such as degree of freedom of design being heightened, application to conventional apparatuses becoming easy and the cost as a system being able to be reduced, and the like.

In the above embodiments, LED and phosphors are used as the sensor probe 101, but it is also possible to use a structure which can be changed mechanically by at least one of current, voltage and temperature as the sensor probe, and to measure the changed amount by means of an optical means for recognition in order to practice the present invention and to attain the objects of the present invention.

According to the present invention, since the voltage and voltage distribution in an article to be processed, the current passing through the article to be processed, and the temperature of the article to be processed in the semiconductor wafer processing apparatus can be measured easily and simply without lowering the throughput, it is possible to optimize conditions necessary for processing semiconductor wafers sufficiently with ease in a short time.

It should be further understood by those skilled in the art that the foregoing description has been made on embodiments of the invention and that various changes and modifications may be made in the invention without departing from the spirit of the invention and the scope of the appended claims.

What is claimed is:

1. An apparatus for processing a semiconductor, which comprises
   an airtight processing chamber separated from the air,
   a wafer stage installed in the chamber, and
   a wafer sensor module equipped with sensor probes, each sensor probe capable of detecting at least one of electric current passing through an article to be processed, voltage and temperature, said wafer sensor module positioned on the stage in exchange of the article to be processed after carried into the processing chamber by a transporting means for the article to be processed.

2. An apparatus according to claim 1, wherein measured values detected by the sensor probes are converted to optical signals, which are led out from the processing chamber to the outside.

3. An apparatus according to claim 2, wherein the optical signals are received by a means for receiving optical signals equipped on the stage.

4. An apparatus according to claim 1, wherein the stage has a means for applying an optional voltage to at least one point of the wafer sensor module.

5. An apparatus according to claim 3, wherein the means for receiving optical signals processes at least two optical signals caused by measured values in common and leads to outside of the semiconductor processing apparatus.

6. A wafer sensor module comprising a silicon substrate as a main body, and at least one sensor probe and a luminescent device formed on the main body, said wafer sensor module being positioned on a wafer stage in an apparatus for processing a semiconductor in exchange of a wafer to be processed.

7. A wafer sensor module according to claim 6, wherein the silicon substrate as a main body has almost the same shape as a semiconductor wafer to be processed.

8. An apparatus according to claim 1, wherein the wafer sensor module as a main body has almost the same shape as a semiconductor wafer to be processed.

9. A wafer sensor module according to claim 6, wherein measured values detected by the at least one sensor probe are converted to optical signals to be optically led out from the apparatus to the outside.

10. A wafer sensor module according to claim 9, wherein the optical signals are received by a means for receiving optical signals equipped on the stage.

11. A wafer sensor module according to claim 6, wherein the wafer stage has a means for applying an optional voltage to at least one point of the wafer sensor module.

12. A wafer sensor module according to claim 10, wherein the means for receiving optical signals processes at least two optical signals caused by measured values in common and leads to outside of the apparatus.

13. An apparatus for processing a semiconductor, which comprises an airtight processing chamber, a wafer stage installed in the chamber, and a wafer sensor module equipped with sensor probes, each sensor probe capable of detecting at least one of electric current passing through an article to be processed, voltage and temperature, and equipped with at least one optical signal communication device to optically communicate sensor probe data off said wafer sensor module, said wafer sensor module positionable on the stage in exchange of the article to be processed.

14. An apparatus according to claim 13, wherein optical said sensor probe data communicated off said wafer sensor module is optically led to an outside of the processing chamber.

15. An apparatus according to claim 14, wherein optical said sensor probe data is optically received by an optical receiver provided on at least one of the stage and a wall of the processing chamber.

16. An apparatus according to claim 13, wherein the stage has a means for applying an optional voltage to at least one point of the wafer sensor module.

17. An apparatus according to claim 15, wherein the optical receiver processes at least two optical signals caused by measured values in common and leads the same to an outside of the processing chamber.

18. An apparatus according to claim 13, wherein the wafer sensor module as a main body has almost the same shape as a semiconductor wafer to be processed.

* * * * *